United States Patent
Seven et al.

(10) Patent No.: US 7,170,266 B1
(45) Date of Patent: Jan. 30, 2007

(54) BALANCED, FLOATING, SPREAD-SPECTRUM PULSE WIDTH MODULATOR CIRCUIT

(75) Inventors: Kazim Seven, San Jose, CA (US); Ansuya P. Bhatt, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 264 days.

(21) Appl. No.: 10/871,735

(22) Filed: Jun. 18, 2004

(51) Int. Cl.
*G05F 1/40* (2006.01)
*H03F 3/217* (2006.01)
*H02M 1/12* (2006.01)

(52) U.S. Cl. ..................... 323/268; 330/251
(58) Field of Classification Search ........... 323/268, 323/270, 271, 273, 274, 275, 280, 281, 282, 323/284, 285; 330/10, 75, 105, 106, 251, 330/288, 290, 291, 301, 307
See application file for complete search history.

(56) References Cited

U.S. PATENT DOCUMENTS

| | | | | |
|---|---|---|---|---|
| 4,531,096 A | * | 7/1985 | Yokoyama | 330/10 |
| 5,229,929 A | * | 7/1993 | Shimizu et al. | 363/98 |
| 6,215,290 B1 | * | 4/2001 | Yang et al. | 323/282 |
| 6,317,340 B1 | * | 11/2001 | Niederreiter | 363/41 |
| 6,465,993 B1 | * | 10/2002 | Clarkin et al. | 323/272 |
| 6,489,841 B2 | * | 12/2002 | Takagishi | 330/10 |
| 7,038,534 B2 | * | 5/2006 | Hanzlik | 330/10 |

* cited by examiner

*Primary Examiner*—Matthew V. Nguyen
(74) *Attorney, Agent, or Firm*—Darby & Darby P.C.; Matthew M. Gaffney

(57) ABSTRACT

A fully differential class D amplifier includes a pulse width modulator and a power stage. The pulse width modulator is arranged to employ a differential output signal provided from the power stage as a feedback signal. The pulse width modulator includes a transimpedance amplifier that is arranged to generate a triangle wave from the input signal and the feedback signal. The transimpedance amplifier is arranged to generate the triangle wave such that the triangle wave that has approximately a 50% duty cycle when no input signal is applied. Additionally, the input signal adjusts the frequency of the triangle wave such that the triangle wave is a spread spectrum signal. The triangle wave is compared to a threshold signal to provide a pulse width modulated signal.

20 Claims, 15 Drawing Sheets

BALANCED, FLOATING, SPREAD-SPECTRUM PULSE WIDTH MODULATOR CIRCUIT

FIELD OF THE INVENTION

The invention is related to amplifiers, and in particular, to a balanced, floating, spread-spectrum class D amplifier circuit.

BACKGROUND OF THE INVENTION

In audio applications, a speaker may be driven by an amplifier, typically a class AB amplifier. However, class AB amplifiers have low power efficiency. In portable applications, such as cell phones, personal desktop assistants (PDAs), and headphone amplifiers, battery life can be a significant concern. Also, in high-power systems, (e.g. 5 W–300 W), metal heat sinks are typically required because the low efficiency of Class AB amplifiers.

Unlike class AB amplifiers, class D amplifiers have high efficiency. A class D architecture could significantly increase the battery life in portable systems, and could allow multichannel high-power systems to be designed very light and compact by eliminating the heat sinks that are typically employed. However, when a class D amplifier is included in an integrated circuit (IC), substrate noise and electromagnetic interface (EMI) may both be significant problems.

BRIEF DESCRIPTION OF THE DRAWINGS

Non-limiting and non-exhaustive embodiments of the present invention are described with reference to the following drawings, in which.

DETAILED DESCRIPTION

Figure 1:
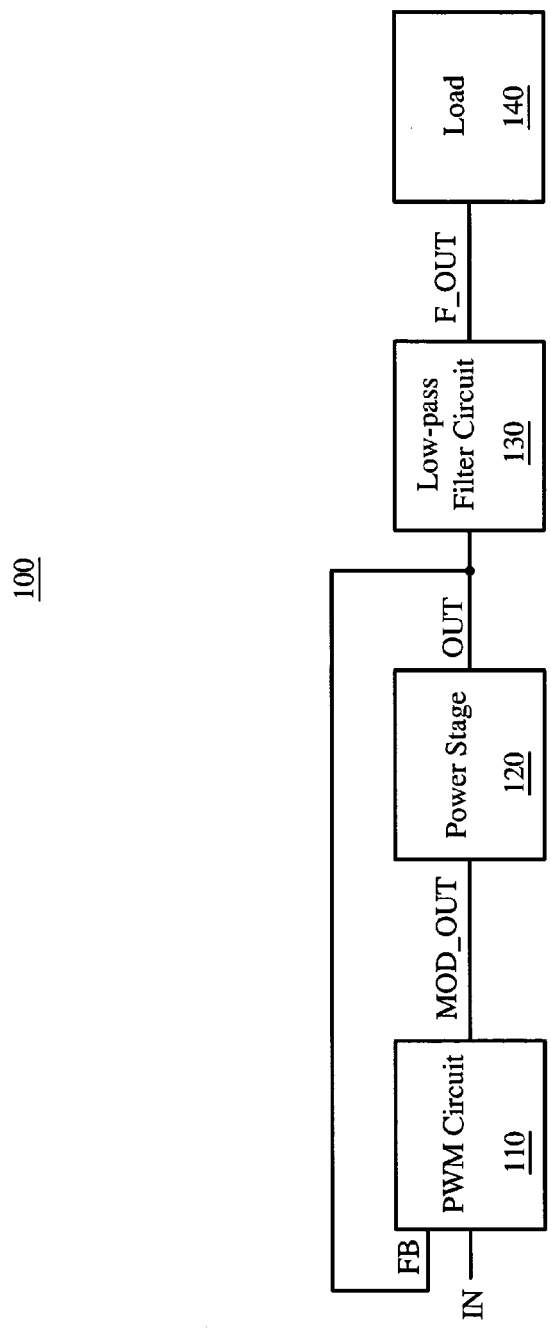
FIG. 1 shows a block diagram of an embodiment of a class D amplifier circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal.

Briefly stated, the invention is related to a fully differential spread-spectrum class D amplifier that includes a pulse width modulator and a power stage. The pulse width modulator is arranged to employ a differential output signal provided from the power stage as a feedback signal. Also, the pulse width modulator includes a transimpedance amplifier that is arranged to generate a triangle wave from the input signal and the feedback signal. The transimpedance amplifier is arranged to generate the triangle wave such that the triangle wave that has approximately a 50% duty cycle when no input signal is applied. Additionally, the input signal adjusts the frequency of the triangle wave such that the triangle wave is a spread spectrum signal. The triangle wave is compared to a threshold signal to provide a pulse width modulated signal.

FIG. 1 shows a block diagram of an embodiment of class D amplifier circuit 100. Class D amplifier circuit 100 includes pulse width modulation (PWM) circuit 110, power stage 120, low-pass filter circuit 130, and load 140.

PWM circuit 110 is arranged to provide modulation output signal MOD_OUT based, in part, on input signal IN and feedback signal FB. PWM circuit 110 provides a triangle wave (not shown) that has approximately a 50% duty cycle if signal IN is substantially zero. The duty cycle of the triangle wave may be disturbed from the 50% duty cycle based on signal IN. PWM circuit 110 is arranged to provide signal MOD_OUT based, in part, on the triangle wave.

Power stage 120 is arranged to provide output signal OUT based on signal MOD_OUT. In one embodiment, signal FB is signal MOD_OUT. In another embodiment, signal FB is a signal other than signal OUT that is based, in part, on signal MOD_OUT.

Low-pass filter circuit 130 is arranged to provide signal F_OUT from signal OUT. The low-pass filtering function provided by low-pass filter circuit 130 may de-modulate signal OUT to provide an audio signal. Load circuit 140 is arranged to be driven by signal F_OUT.

Figure 2:
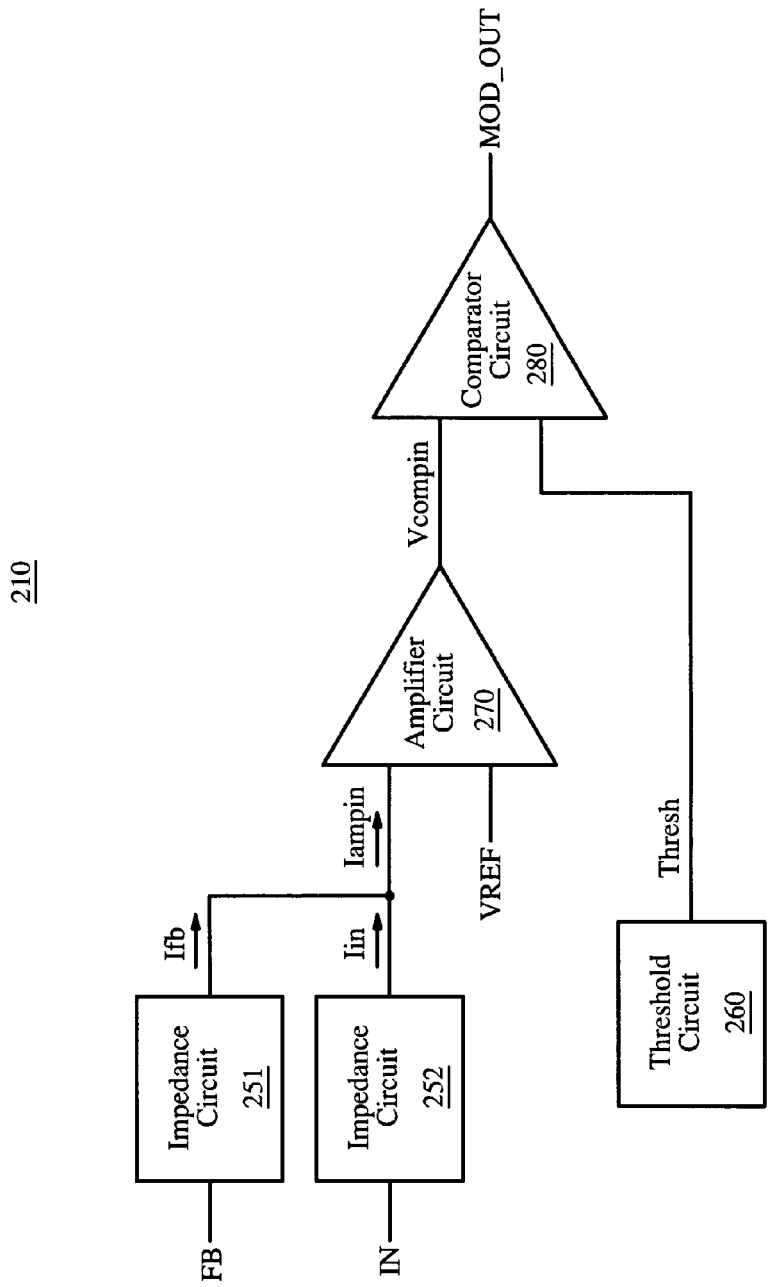
FIG. 2 illustrates a block diagram of an embodiment of the pulse width modulator circuit of FIG. 1.

FIG. 2 illustrates a block diagram of an embodiment of PWM circuit 210. PWM circuit 210 may operate in a substantially similar manner to PWM circuit 110 of FIG. 1, and may operate in a different manner in some ways. PWM circuit 210 includes impedance circuits 251–252, amplifier circuit 270, comparator circuit 280, and threshold circuit 260.

Impedance circuit 251 is arranged to provide current Ifb from signal FB. Impedance circuit 252 is arranged to provide current Iin from signal IN. Also, impedance circuits 251 and 252 are coupled together at node N1 such that current Iampin is substantially given by Ifb+Iin. Amplifier circuit 270 is arranged to provide receive signal Iampin and VREF. Amplifier circuit 270 is further arranged to adjust the voltage at node N1 such that the voltage at node N1 is substantially equal to VREF. Also, amplifier circuit 270 is arranged to provide signal Vcompin from signal Iampin such that a rate of change of signal Vcompin is based on current Iampin.

Threshold circuit 260 is arranged to provide signal Thresh. Additionally, comparator circuit 280 is arranged to compare signals Vcompin and Thresh, and to provide signal MOD_OUT in response to the comparison.

Figure 3:
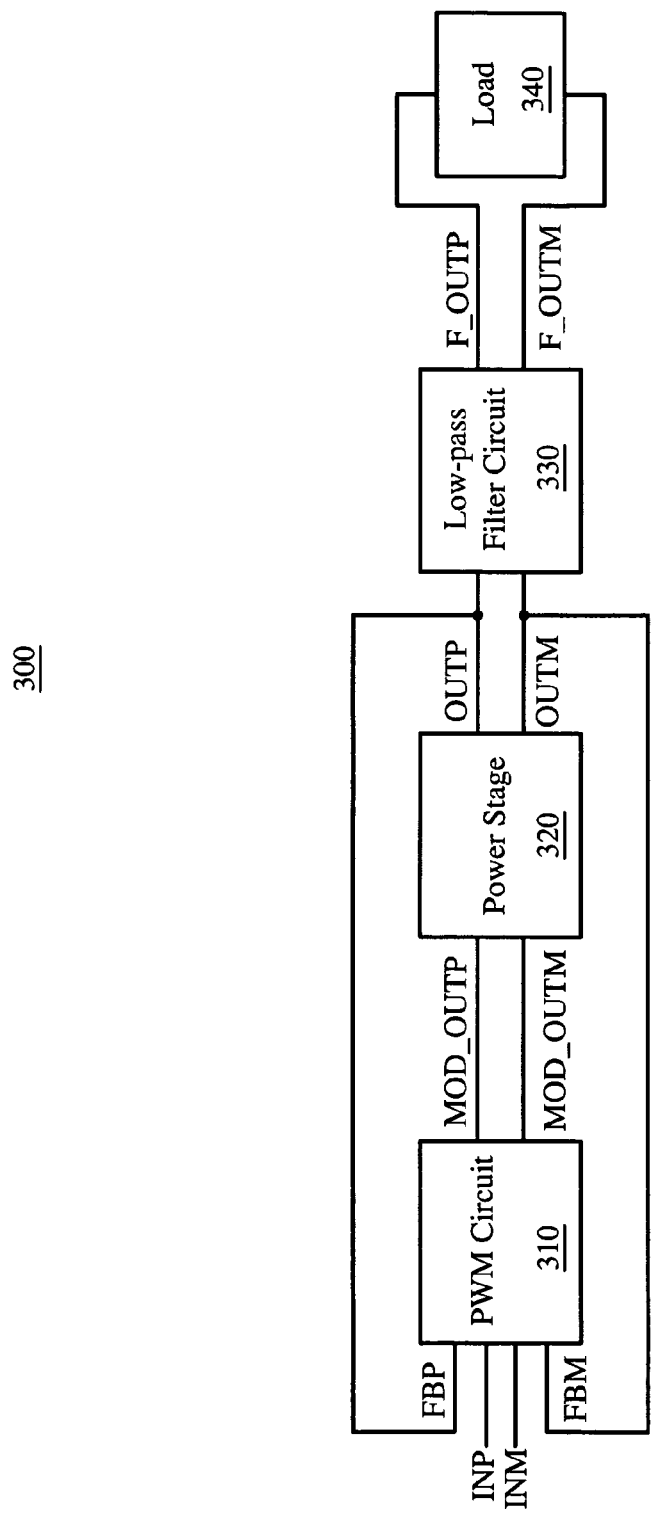
FIG. 3 shows a block diagram of another embodiment of a class D amplifier circuit that is fully differential.

FIG. 3 shows a block diagram of an embodiment of a class D amplifier circuit 300, a fully differential circuit. Components in circuit 300 may operate in a substantially similar manner to similarly-named components in circuit 100, and may operate in a different manner in some ways. In circuit 300, signal IN is a differential signal that includes signals INP and INM. Similarly, signals FB, OUT, and F_OUT are differential signals that include signals FBP and FBM, OUTP and OUTM, and F_OUTP and F_OUTM, respectively.

Figure 4:
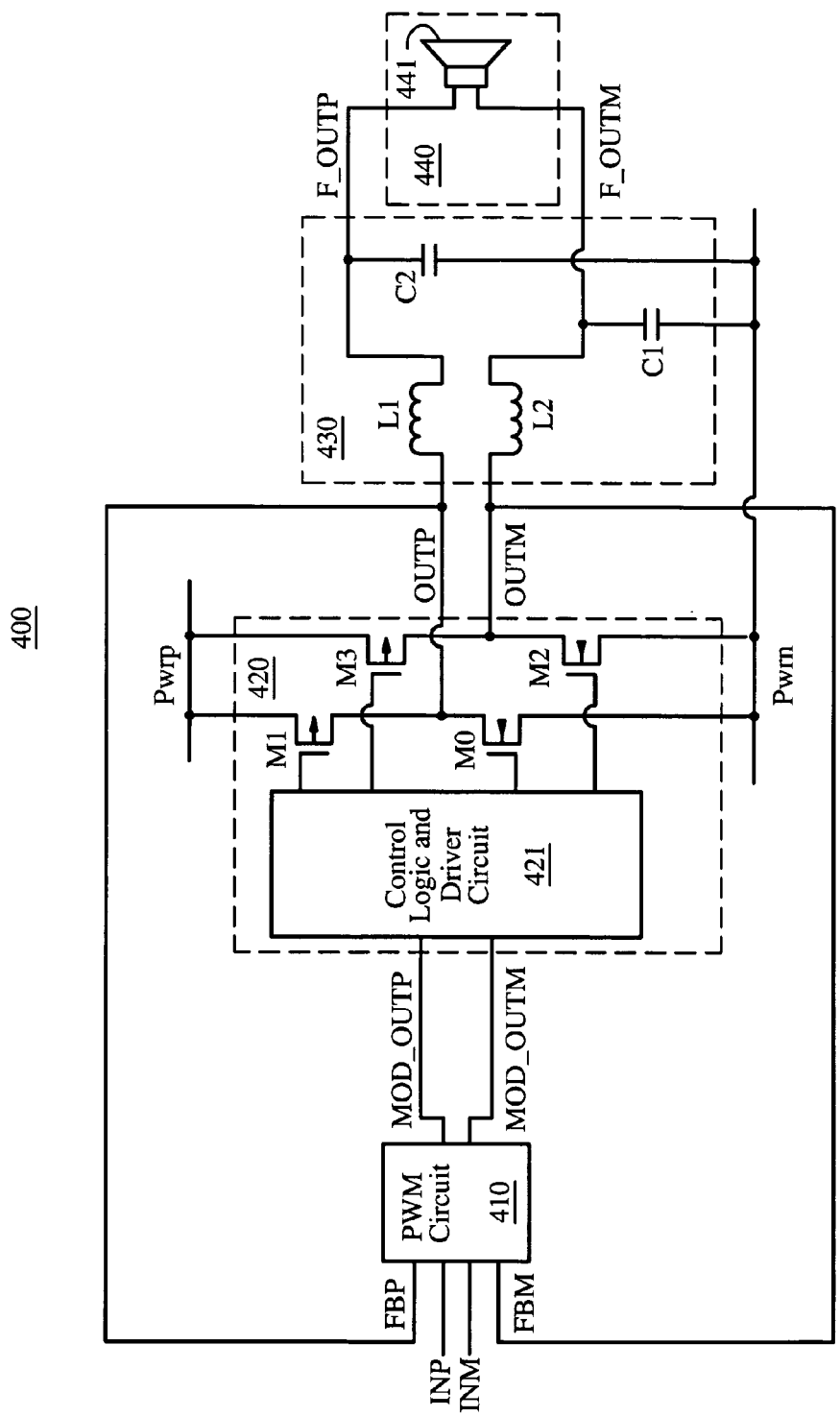
FIG. 4 shows a block diagram of an embodiment of the class D amplifier circuit of FIG. 3 in which embodiments of the power stage, the low-pass filter circuit, and the load of FIG. 3 are shown in greater detail.

FIG. 4 shows a block diagram of an embodiment of class D amplifier circuit 400 and shows embodiments of the power stage, the low-pass filter circuit, and the load in greater detail. Components in circuit 400 may operate in a substantially similar manner to similarly-named components in circuit 300, and may operate in a different manner in some ways. Power stage 420 includes transistors M0–M3 and control logic and driver circuit 421. Low-pass filter circuit 430 includes inductors L1 and L2 and capacitors C1 and C2. Load 440 includes speaker 441.

Figure 5:
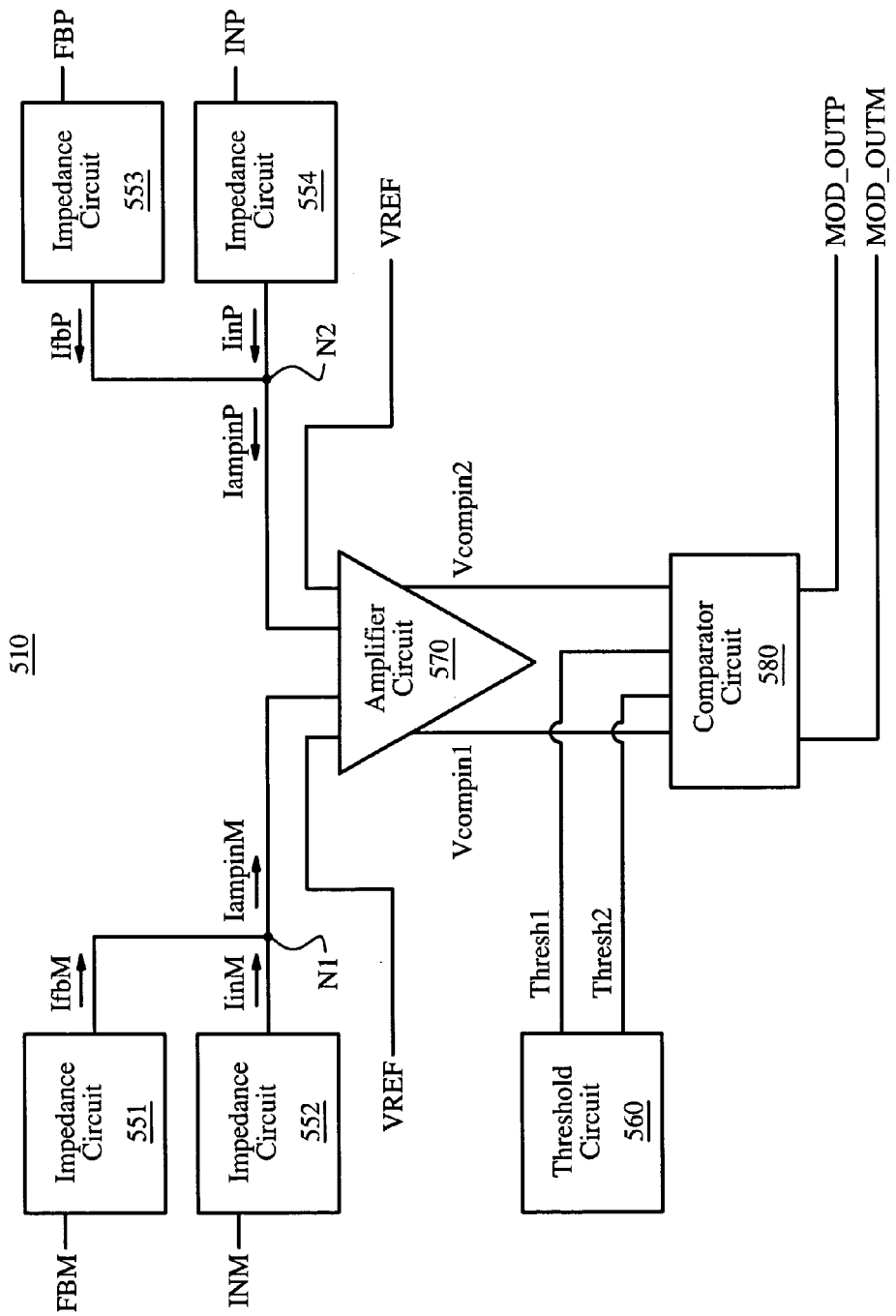
FIG. 5 illustrates a block diagram of an embodiment of the pulse width modulator circuit of FIG. 3 and/or FIG. 4.

FIG. 5 illustrates a block diagram of an embodiment of the PWM circuit 510. PWM circuit 510 may operate in a substantially similar manner as PWM circuit 210 of FIG. 2 and PWM circuit 310 of FIG. 3, and may operate in a different manner in some ways.

Impedance circuit 551 is arranged to provide current IfbM from signal FBM. Impedance circuit 552 is arranged to provide current IinM from signal INM. Also, impedance circuits 551 and 552 are coupled together at node N1 such that current IampinM is substantially given by IfbM+IinM.

Similarly, impedance circuit 553 is arranged to provide current IfbP from signal FBP. Impedance circuit 554 is arranged to provide current IinP from signal INP. Impedance circuits 553 and 554 are coupled together at node N2 such that current IampinP is substantially given by IfbP+IinP.

Amplifier circuit 570 is further arranged to adjust the voltage at nodes N1 and N2 such that the voltages at node N1 and N2 are each substantially equal to VREF. Also, amplifier circuit 570 is arranged to provide signal Vcompin1 and Vcompin2 from signals IampinP and Iampin2 such that a rate of change of signals Vcompin1 and Vcompin2 are based on currents Iampin1 and Iampin2.

Threshold circuit 560 is arranged to provide signals Thresh1 and Thresh2. Additionally, comparator circuit 580 is arranged to provide signal MOD_OUTP and MOD_OUTM from signals Vcompin1, Vcompin2, Thresh1 and Thresh2.

Figure 6:
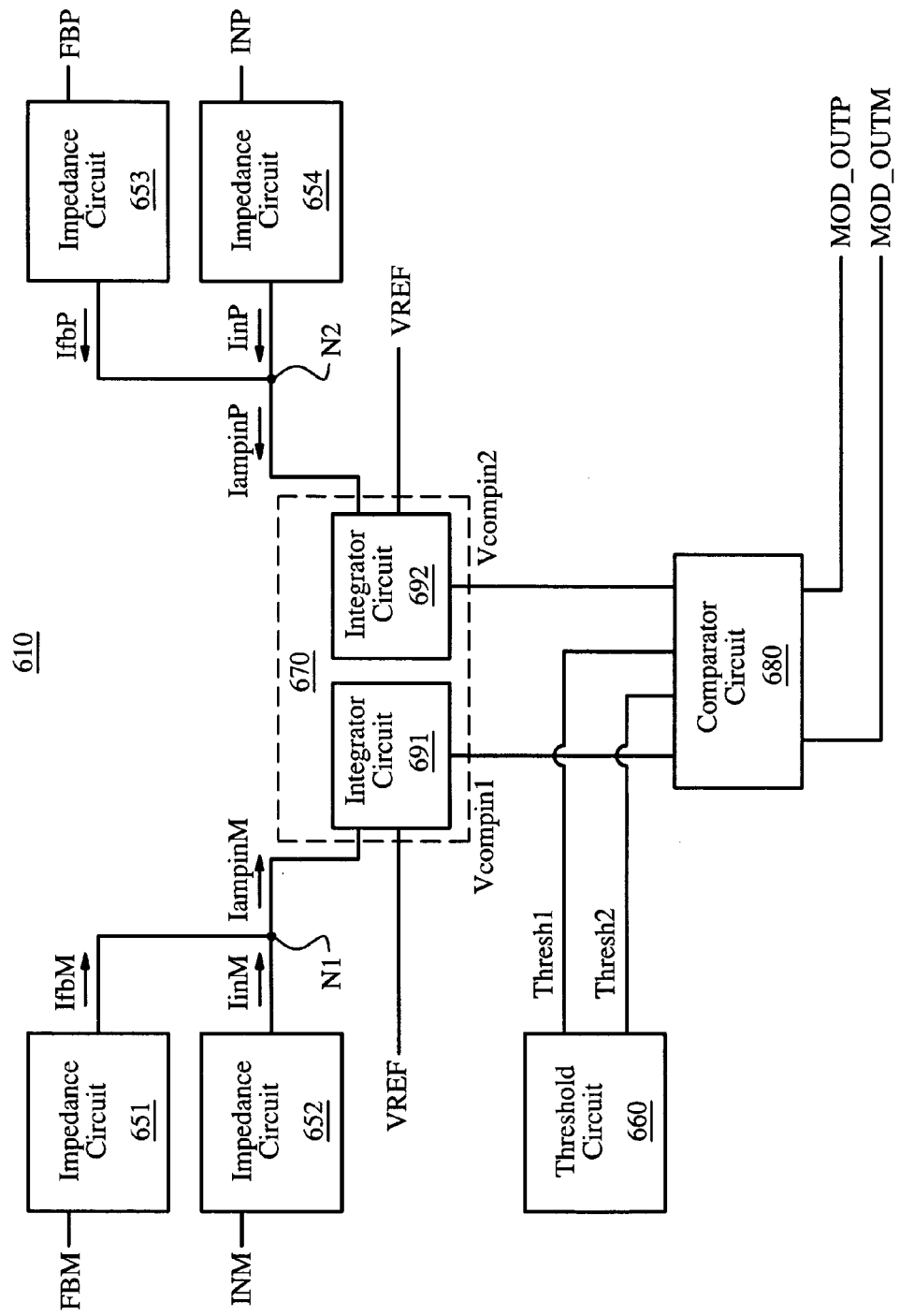
FIG. 6 shows a block diagram of an embodiment of the pulse width modulator circuit of FIG. 5 in which an embodiment of the amplifier circuit of the pulse width modulator circuit includes integrator circuits.

FIG. 6 shows a block diagram of an embodiment of PWM 610 in which an embodiment of the amplifier circuit includes integrator circuits. Components in PWM circuit 610 may operate in a substantially similar manner to similarly-named components in PWM circuit 510 of FIG. 5, and may operate in a different manner in some ways. Amplifier circuit 670 includes integrator circuits 691 and 692.

In operation, integrator circuit 691 provides signal Vcompin1 from current IampinM. Integrator circuit 692 is arranged to provide signal Vcompin2 from current IampinP. In one embodiment, integrator circuit 691 may be an operational amplifier having an inverting input that is coupled to node N1, a noninverting input that is arranged to receive signal VREF, an output that is arranged to provide signal Vcompin, and having a capacitor that is coupled between the inverting input and the output.

Figure 7:
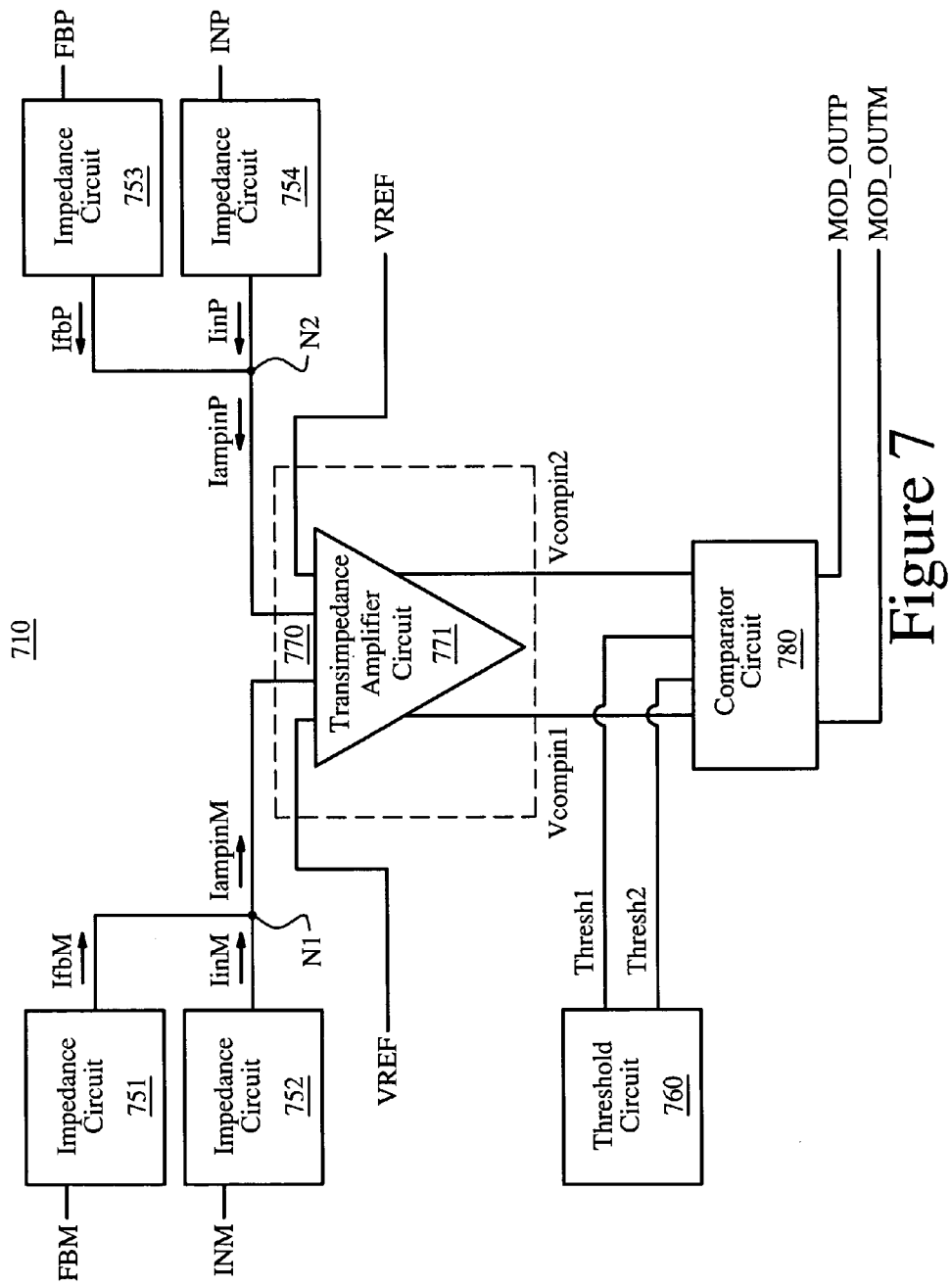
FIG. 7 illustrates a block diagram of an embodiment of the pulse width modulator circuit of FIG. 5 in which an embodiment of the amplifier circuit of the pulse width modulator circuit includes a transimpedance amplifier circuit.

FIG. 7 illustrates a block diagram of an embodiment of the PWM circuit 770 that includes a transimpedance amplifier circuit. Amplifier circuit 770 includes transimpedance amplifier circuit 771. Employing transimpedance amplifier circuit 771 may be preferable to employing integrator circuits, because transimpedance amplifier circuit 771 may have a significantly greater slew rate and significantly greater bandwidth.

Figure 8:
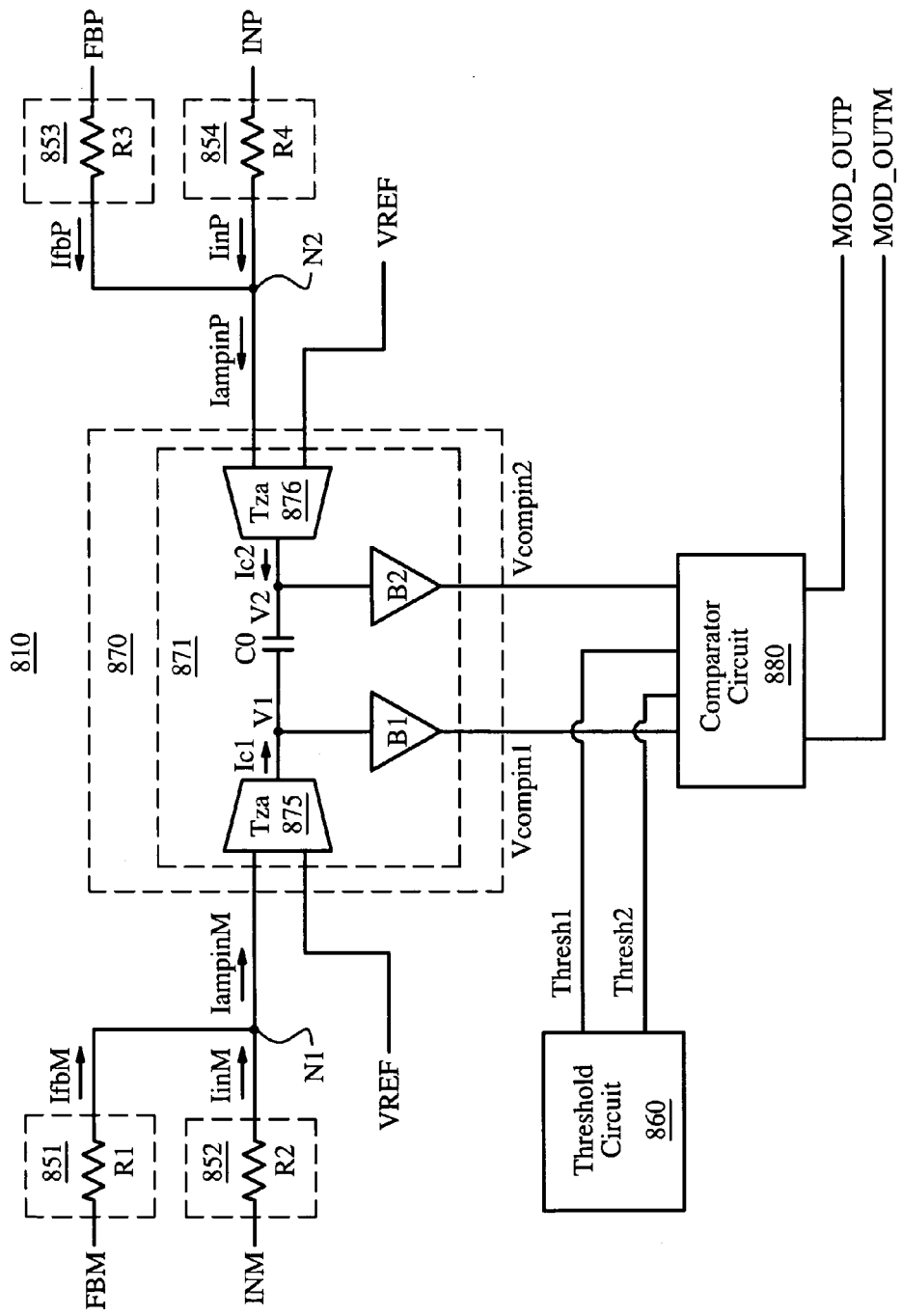
FIG. 8 shows a block diagram of an embodiment of the pulse width modulator circuit of FIG. 7 in which an embodiment of the transimpedance amplifier circuit is illustrated in greater detail.

FIG. 8 shows a block diagram of an embodiment of PWM circuit 810, in which an embodiment of the transimpedance amplifier circuit is shown. Components in PWM circuit 810 may operate in a substantially similar manner to similarly-named components in PWM circuit 710 of FIG. 7, and may operate in a different manner in some ways. Transimpedance amplifier circuit 810 includes tza blocks 875 and 876, capacitor circuit C0, and buffer circuits B1 and B2.

Figure 9:
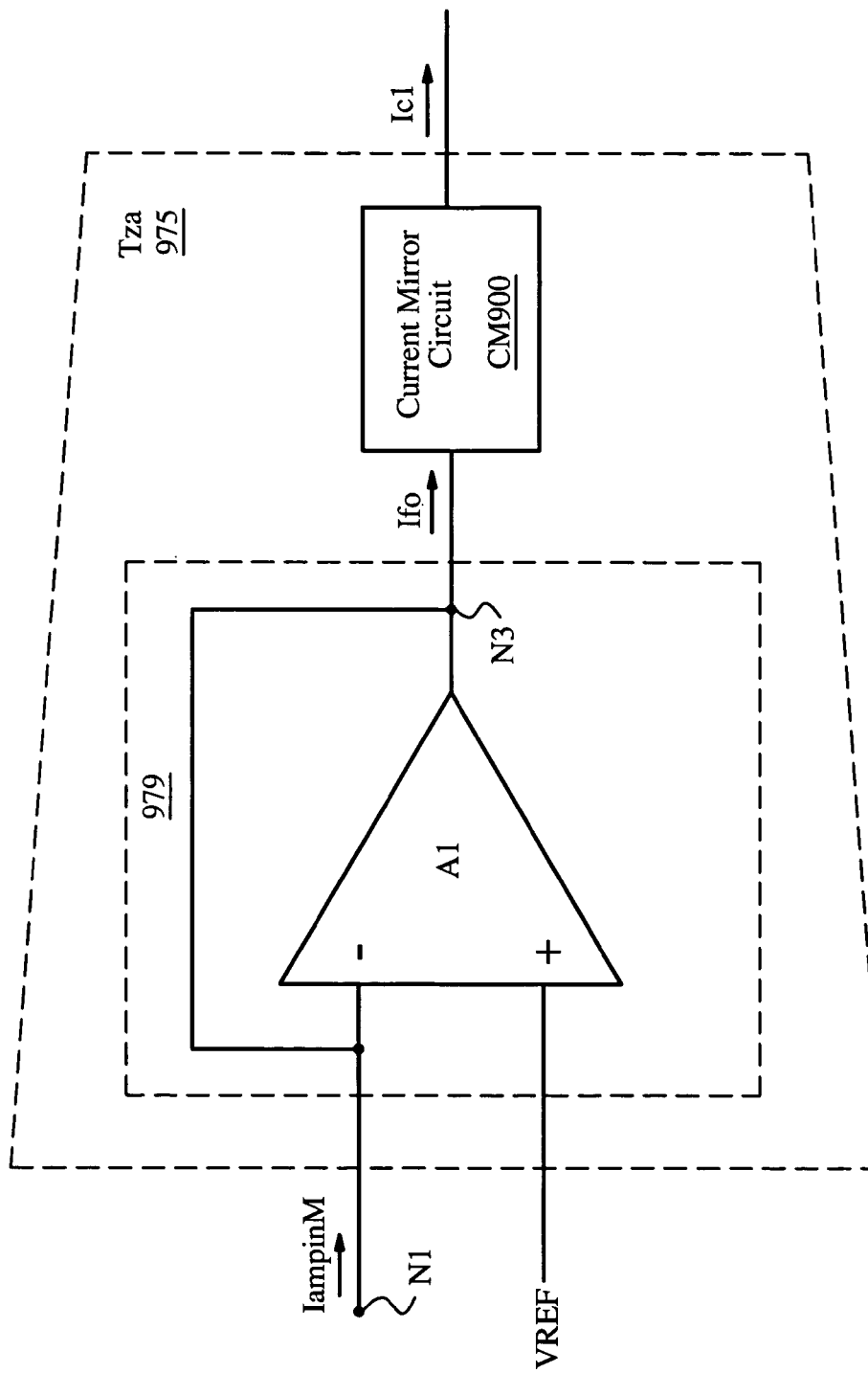
FIG. 9 illustrates a block diagram of an embodiment of the tza block of the transimpedance amplifier circuit of FIG. 8.

Tza block 875 is arranged to provide current Ic1 from current IampinM. Similarly, Tza block 876 is arranged to provide current Ic2 from current IampinP. An embodiment of tza block 875 is illustrated in FIG. 9 below. During operation of PWM circuit 810, current Ic1 and Ic2 are substantially the same, except that current Ic2 is a sink current if current Ic1 is a source current, and vice versa.

Further, capacitor circuit C0 is arranged to provide a voltage V1–V2 in response to currents Ic1 and Ic2. Voltage V1–V2 ramps upwards if current Ic1 is a source current, and ramps downwards if current Ic1 is a sink current. Accordingly, voltage V1–V2 is a triangle wave. Voltage V1–V2 has substantially a 50% duty cycle if input signal INP–INM is substantially zero. Otherwise, the duty cycle and frequency of voltage V1–V2 are adjusted by input signal INP–INM. The frequency of voltage V1–V2 is inversely proportional to input signal INP–INM. Accordingly, voltage V1–V2 is a spread-spectrum signal.

Also, buffer circuit B1 is arranged to buffer voltage V1 to provide voltage Vcompin1. Similarly, buffer circuit B2 is arranged to buffer voltage B2 to provide voltage Vcompin2.

FIG. 9 illustrates a block diagram of tza block 975, which is an embodiment of tza block 875. Tza block 975 includes follow circuit 979 and current mirror circuit CM900. Follow circuit 979 includes operational amplifier circuit A1. Operational amplifier circuit A1 is configured to adjust the voltage at node N1 such that the voltage at node N1 is substantially equal to VREF. Also, operational amplifier circuit A1 is arranged such that all or substantially all of current IampinM to node N3. Current mirror circuit CM900 is arranged to provide current Ic1 based on follower output current Ifo such that current Ic1 has the opposite polarity of current Ifo. Precision is provided by operational amplifier circuit A1.

Figure 10:
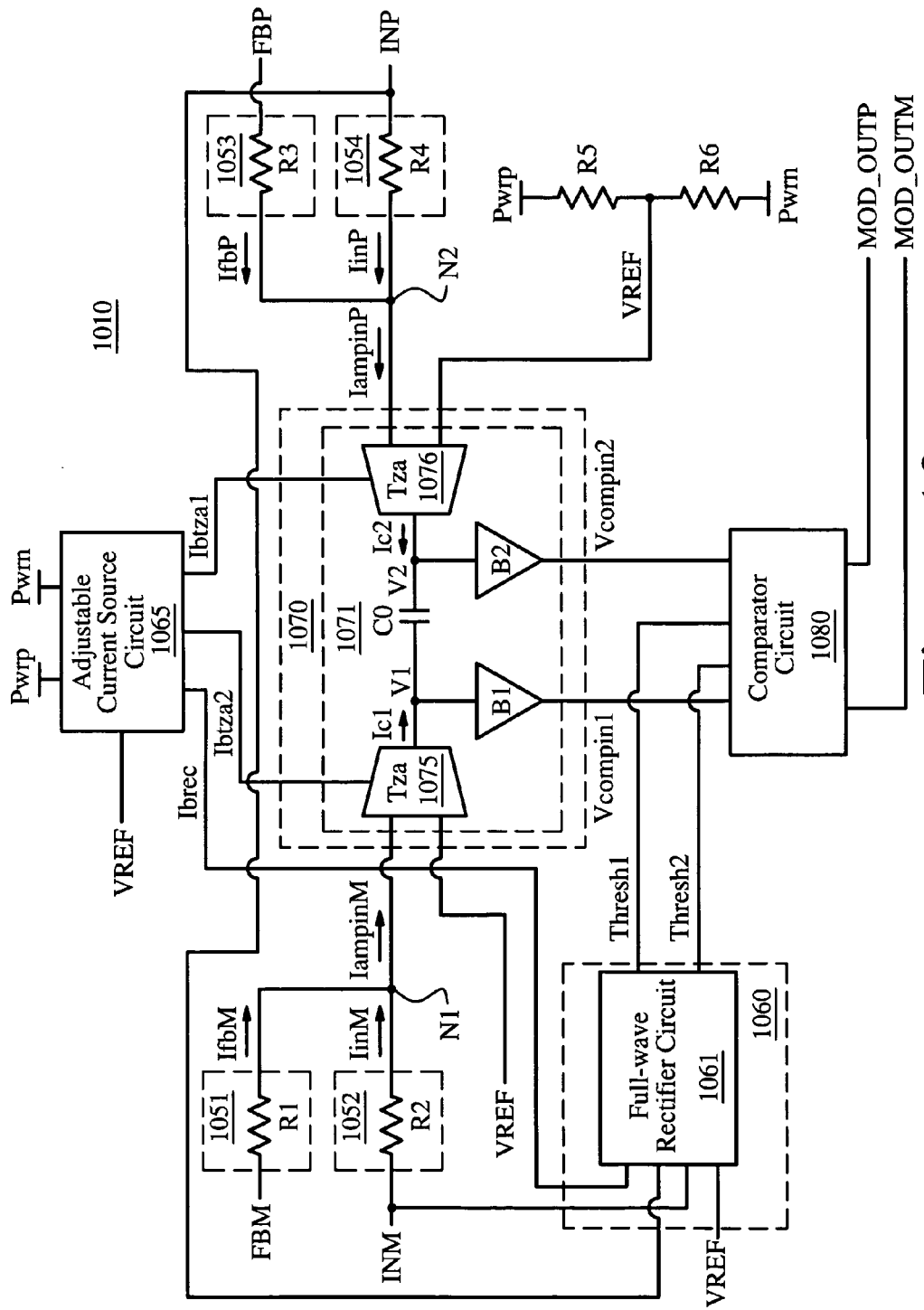
FIG. 10 shows a block diagram of an embodiment of the pulse width modulator circuit of FIG. 8 which includes a bias circuit and in which the threshold circuit includes a full-wave rectifier circuit.

FIG. 10 shows a block diagram of an embodiment of PWM circuit 1010, which includes a bias circuit and in which the threshold circuit includes a full-wave rectifier circuit. Components in PWM circuit 1010 may operate in a substantially similar manner to similarly-named components in PWM circuit 810 of FIG. 8, and may operate in a different manner in some ways. PWM circuit 1010 further includes adjustable current source circuit 1065 and resistors R5 and R6. Threshold circuit 1060 includes full-wave rectifier circuit 1061. Impedance circuit 1051–1054 includes resistors R1–R4, respectively.

Resistors R5 and R6 are arranged as a voltage divider to provide signal VREF from power supply signals Pwrp and Pwrn. In one embodiment, resistors R5 and R6 have substantially the same resistance such that VREF is substantially given by (Pwrp–Pwrn)/2.

Additionally, full-wave rectifier circuit 1061 is arranged to provide threshold signals Thresh1 and Thresh2 such that signals Thresh1 and Thresh2 are full-wave rectified currents. Currents Thresh1 and Thresh2 are provided by rectifying input signals INP and INM.

Adjustable current source circuit 1065 is arranged to provide bias currents Ibrec, Ibtza1, and Ibtza2 such that currents Ibrec, Ibtza1, and Ibtza2 are each substantially proportional to power supply voltage Pwrp–Pwrn. Tza block 1075 is arranged to adjust current Ic1 in response to current Ibtza2 such that current Ic1 is substantially independent of power supply voltage Pwrp–Pwrn. Similarly, Tza block 1076 is arranged to adjust current Ic2 in response to current Ibtza1 such that current Ic2 is substantially independent of power supply voltage Pwrp–Pwrn. Also, current Ibtza2 is employed for total harmonic distortion (THD) correction. Current IampinM is proportional to power supply voltage Pwrp–Pwrn. By providing current Ibtza2 to a current mirror in tza block 1075, crossover distortion may be prevented.

Also, full-wave rectifier circuit 1061 is arranged to adjust currents Thresh1 and Thresh2 based on current Ibrec, such that currents Thresh1 and Thresh2 are each proportional of power supply voltage Pwrp–Pwrn. Because Thresh1 and Thresh2 are proportional to power supply voltage Pwrp–Pwrn, the carrier frequency of modulation output signal MOD_OUTP–MOD_OUTM is substantially unaffected by changes in power supply voltage Pwrp–Pwrn.

PWM circuit 1010 is fully differential. The signals are not referenced to ground. Accordingly, power supply noise and substrate noise are differentially rejected. If ripple occurs in the power supply, the ripple is differentially rejected. Accordingly, PWM circuit 1010 has high PSRR and low THD.

Further, PWM circuit 1010 is spread spectrum, which substantially reduces EMI (electromagnetic interference). Even though PWM circuit 1010 is spread-spectrum, the frequency of voltage V1–V2 is adjusted for by full-wave rectifier circuit 1061 by adjusting currents Thresh1 and Thresh 2, which in turn adjusts the threshold of comparator circuit 1080.

Transimpedance amplifier 1071 is a differential transimpedance amplifier that includes two substantially identical transimpedance amplifiers. The two substantially identical transimpedance amplifier share capacitor circuit C0. That is, tza block 1075, capacitor C0, and buffer circuit B1 form one transimpedance amplifier, and tza block 1076, capacitor C0, and buffer circuit B2 form another transimpedance amplifier.

Further, because PWM circuit 1010 employs transimpedance amplifier circuit 1071, PWM circuit 1010 operates relatively fast. Because of the fast operation of transimpedance amplifier circuit 1071, the edges of triangle voltage V1–V2 are very linear. Also, PWM circuit 1010 employs double feedback at the carrier frequency, making adjustments at each period of voltage V1–V2. Accordingly, PWM circuit 1010 has very low total harmonic distortion (THD) throughout the audio band of 20 Hz to 20 KHz.

As described above, full-wave rectifier circuit 1061, tza block 1075, and tza block 1076 each employ currents Ibrec, Ibtza2, and Ibtza1 respectively to provide power supply rejection, and to keep the carrier frequency of signal MOD_OUTP–MOD_OUTM independent of power supply voltage pwrp–pwrn. In one embodiment, PWM circuit 1010 has approximately 84 dB of power supply rejection. PWM circuit 1010 is capable if performing modulation on an input signal INP–INM that may be either an analog audio signal, a digital input signal (e.g., from a digital signal processor), or the like.

Figure 11:
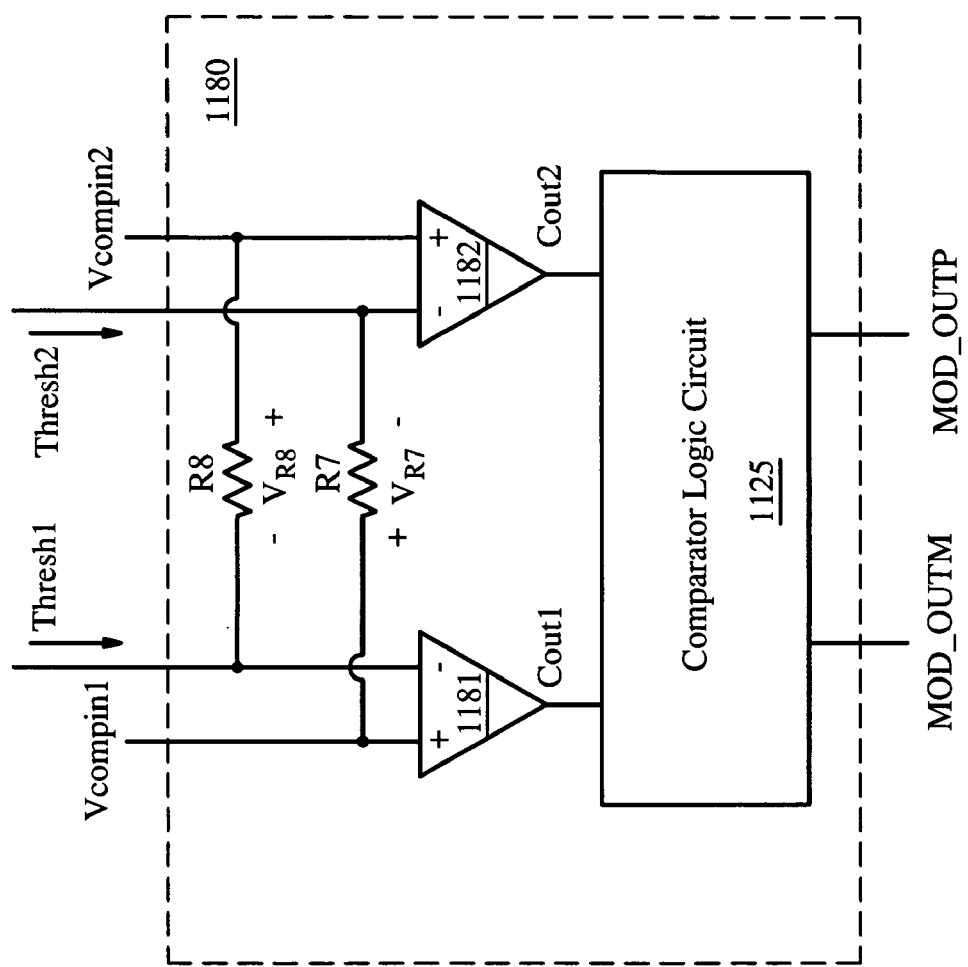
FIG. 11 illustrates a block diagram of an embodiment of the comparator circuit of FIG. 10.

FIG. 11 illustrates a block diagram of an embodiment of comparator circuit 1180. Comparator circuit 1180 may be arranged to operate in a similar manner as comparator circuit 1080, and may operate in a different manner in some ways. Comparator circuit 1180 includes comparator 1181 and 1182, resistors R7 and R8, and comparator logic circuit 1125.

In operation, if comparator 1181 trips, voltage V1–V2 changes from a rising ramp to a falling ramp. Similarly, if comparator 1182 trips, voltage V1–V2 changes from a falling ramp to a rising ramp. Accordingly, comparator 1181 is arranged to make the comparison during a rising ramp for voltage V1–V2, and comparator 1181 is arranged to making the comparison during a falling ramp for voltage V1–V2.

Resistor R7 is arranged to provide voltage $V_{R7}$ from current Thresh1. Similarly, resistor R8 is arranged to provide voltage $V_{R8}$ from current Thresh2. The comparator threshold $\Delta V$ is substantially given by $V_{R7}$ during a rising ramp for voltage V1–V2, and is substantially given by $V_{R8}$ during a falling ramp for voltage V1–V2.

For each period of voltage V1–V2, the rise time t1 is given by t1=C0*$\Delta V$/(Ic1, Ic2), and similarly, the fall time t2 is given by t2=C0*$\Delta V$/(Ic1, Ic2). The period of oscillation Tosc of voltage V1–V2 is substantially given by t1+t2. As previously described, the frequency of voltage V1–V2 is inversely proportion to input signal INP–INM. However, this frequency drop is compensated for by modulating $\Delta V$ (via currents Thresh1 and Thresh2) such that the carrier frequency of modulation output signal MOD_OUTP–MOD_OUTM is kept away from the passband of the low-pass filter (e.g. low-pass filter circuit 130 of FIG. 1).

Comparator logic circuit 1125 is arranged to provide signals MOD_OUTP and MOD_OUTM from comparator output signals Cout1 and Cout2. Comparator logic circuit 1125 may include a latch to provide a memory function, and may further include dead zone circuitry to implement a break-before-make configuration.

Figure 12:
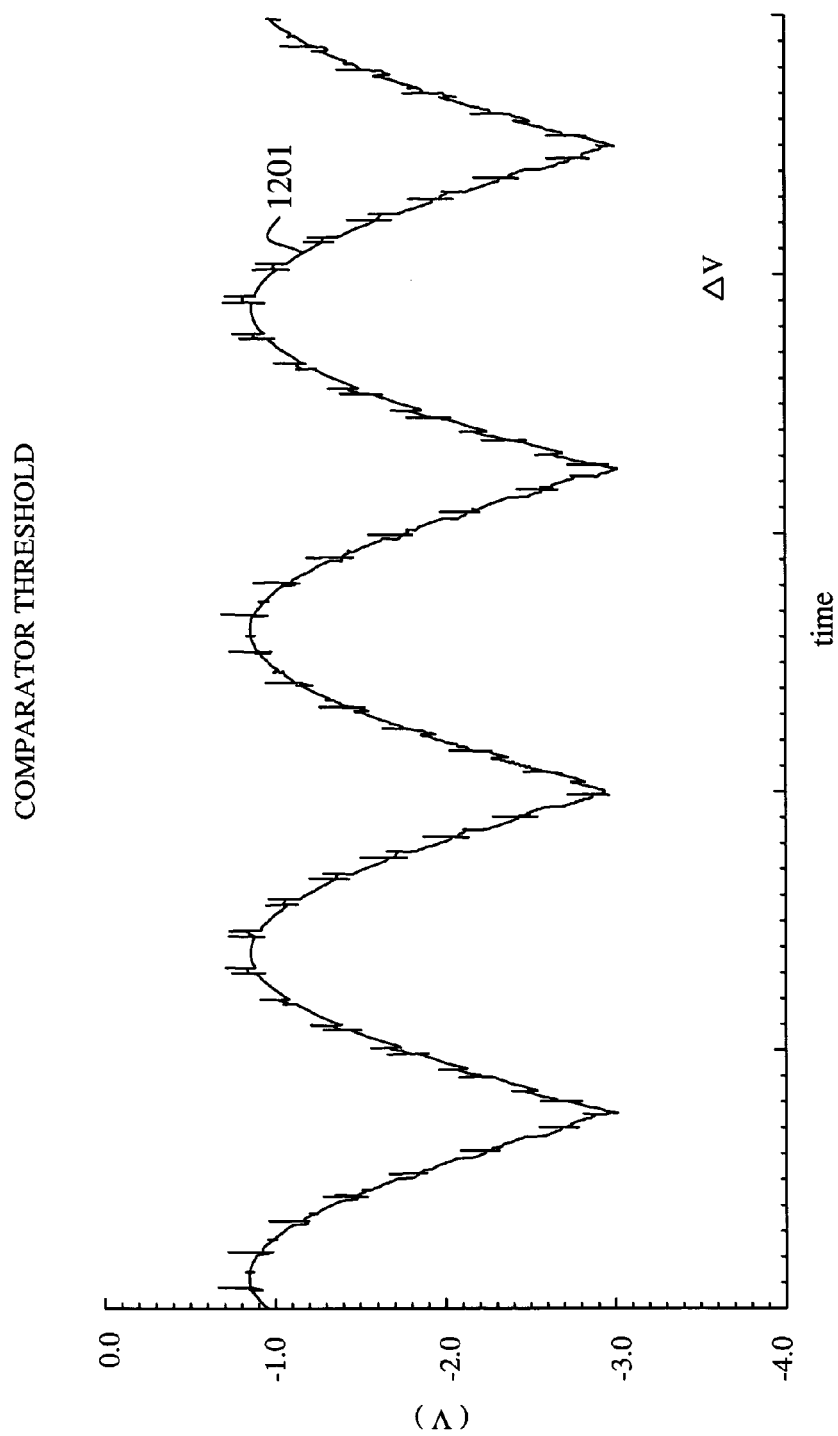
FIG. 12 shows a graph of a waveform of an embodiment of the comparator threshold of FIG. 11.

FIG. 12 shows a graph of waveform 1201 of an embodiment of comparator threshold ΔV. As shown in FIG. 12, ΔV is a double-dome signal that is a full-wave rectified version of an audio input signal.

Figure 13:
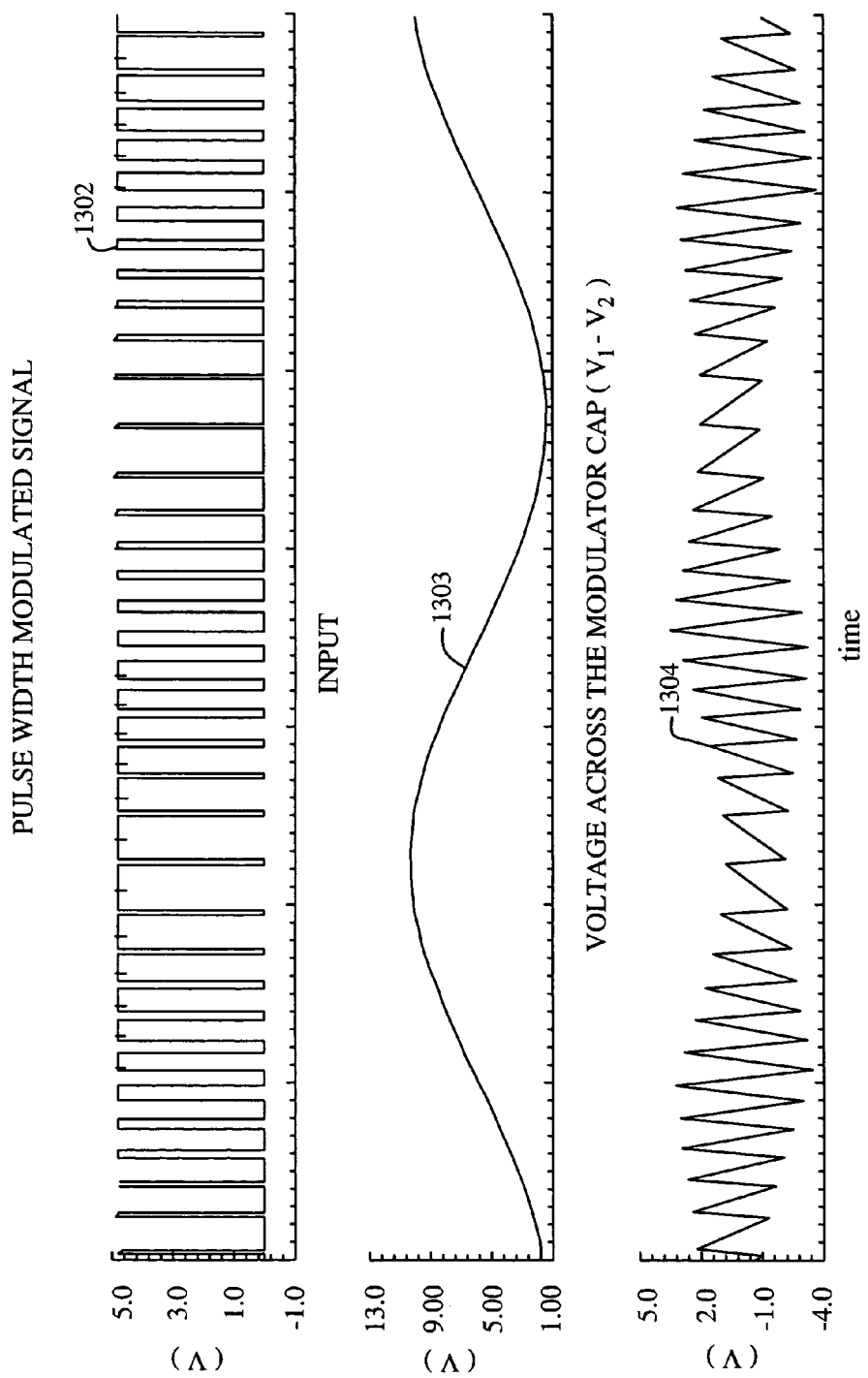
FIG. 13 illustrates a timing diagram of waveforms of embodiments of signals from the pulse width modulation circuit of FIG. 10.

FIG. 13 illustrates a timing diagram of waveforms 1302, 1303, and 1304. Waveform 1302 illustrates an embodiment of a pulse-width modulated signal, such as signal MOD_OUTP or MOD_OUTM. Waveform 1303 illustrates an embodiment of an input signals, such as signal INP or INM. Waveform 1304 illustrates an embodiment voltage V1–V2 that is across capacitor circuit C0 of FIG. 10.

Figure 14:
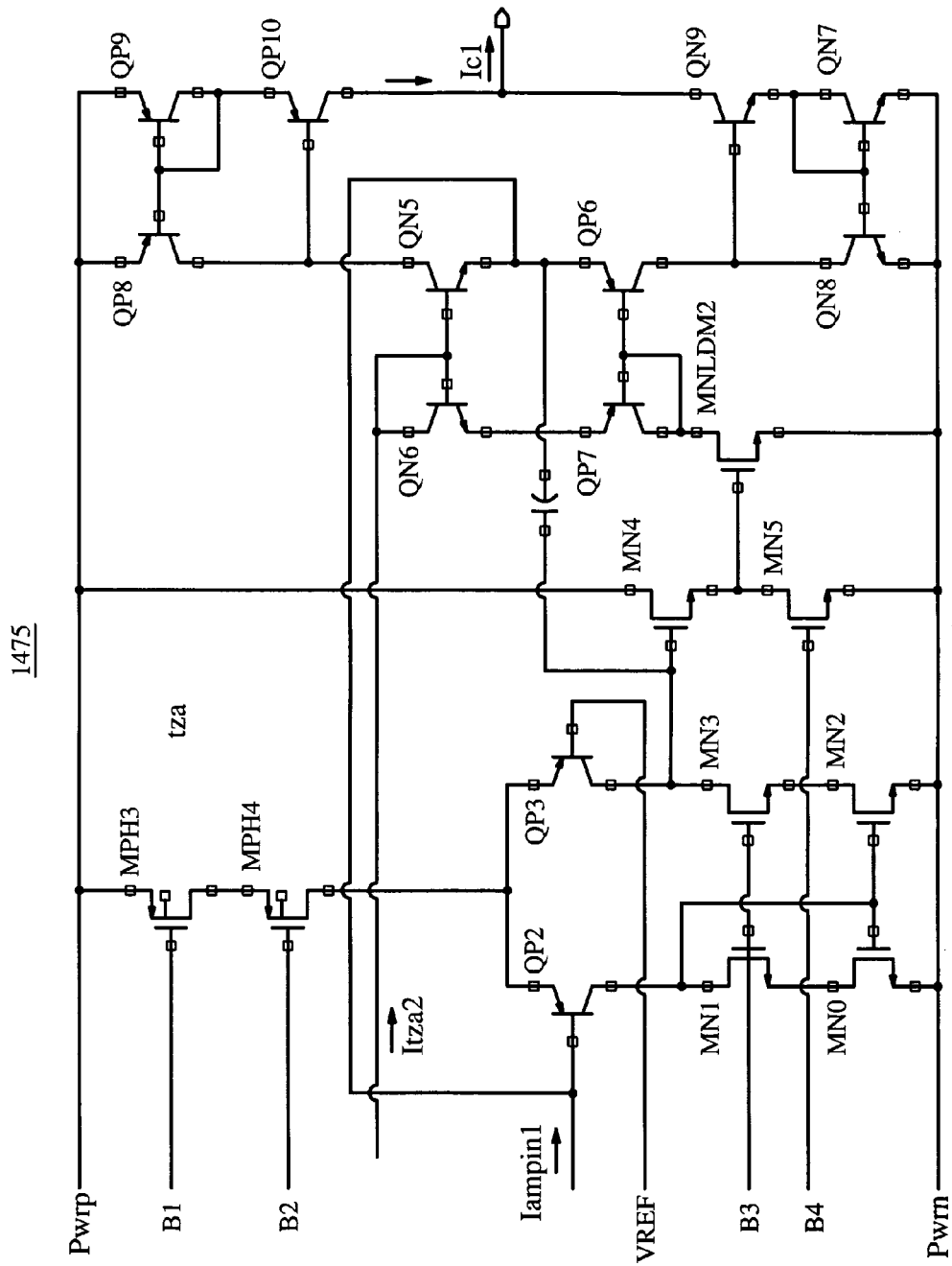
FIG. 14 schematically illustrates an embodiment of the tza block of FIG. 9.

FIG. 14 schematically illustrates an embodiment of tza block 1475. Tza block 1475 may operate in a substantially similar manner to Tza block 975 of FIG. 9, and may operate in a different manner in some ways.

Transistors QP2, QP3, MN1, MN3, MN0, MN3, MPH3, MPH4, MN4, MN5, QN6, QP7, MNLDM2, MN5, and QP6 are arranged as a follower circuit. Transistors QP8–QP10 and QN7–QN9 are arranged as a current mirror circuit.

Transistor QN6 and QN5 are arranged as another current mirror circuit such that current Itza2 is mirrored to the emitter of QN5 such that currents Iampin1 and Itza2 are combined at the emitter of QN5. Accordingly, current Ic1 is substantially independent of changes in power supply pwrp–pwrn.

Figure 15:
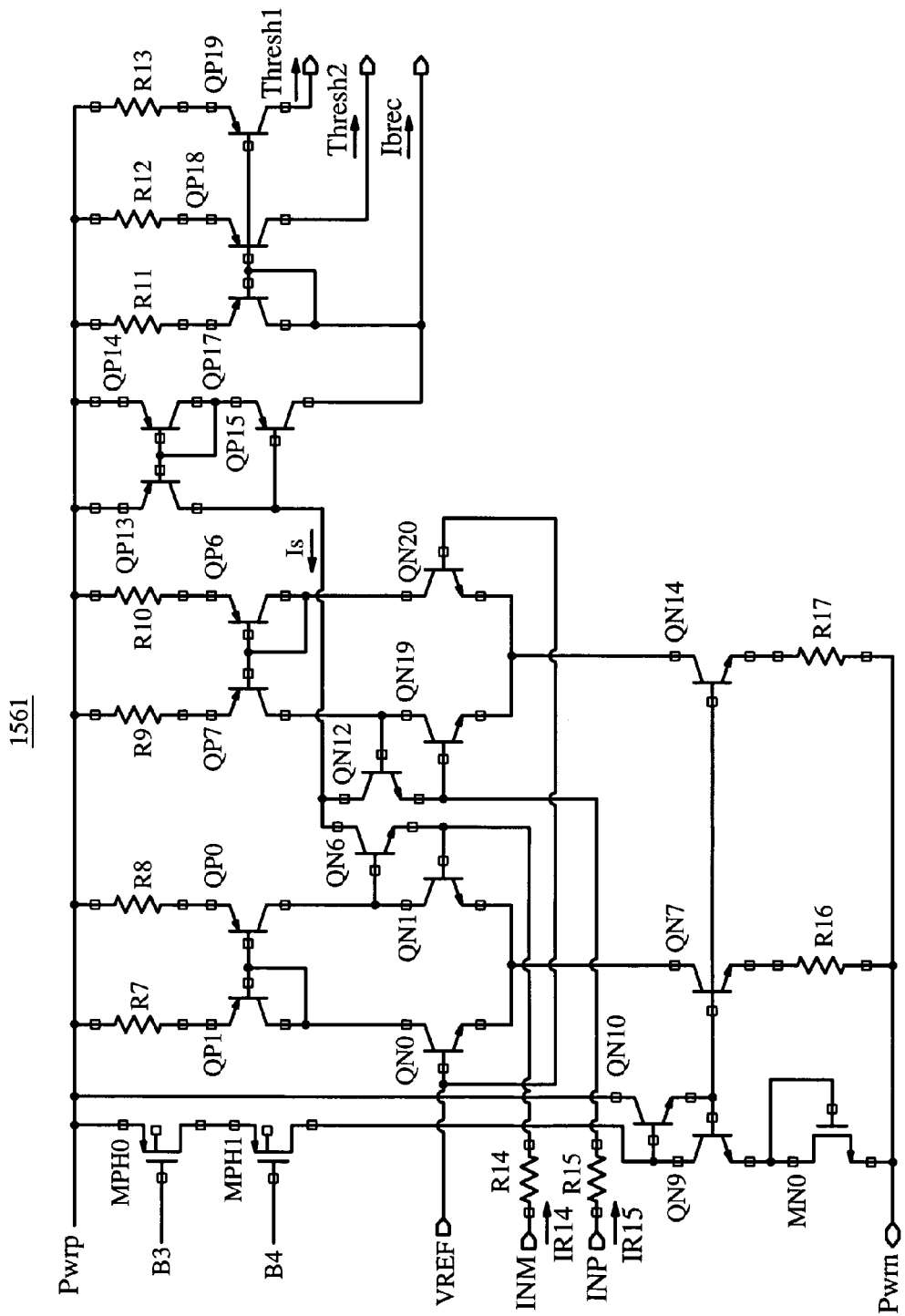
FIG. 15 schematically illustrates an embodiment of the full-wave rectifier circuit of FIG. 10, arranged in accordance with aspects of the invention.

FIG. 15 schematically illustrates an embodiment of full-wave rectifier circuit 1561. Full-wave rectifier circuit 1561 may operate in a substantially similar manner as full-wave rectifier circuit 1061 of FIG. 10, and may operate in a different manner in some ways.

Transistors QN0, QN1, QN7, QN6, QP1, QP0 and resistors R7, R8, and R16 are arranged to operate as a differential amplifier. Transistors QP6, QP7, QN12, QN19, QN20, QN14, and resistors R9, R10, and R17 are arranged to operate as another differential amplifier. The differential amplifiers are arranged such that the voltage at the base of transistor QN1 and the voltage at the base of transistor QN19 are each substantially equal to VREF during operation. Accordingly, current IR14 may be substantially given by (VREF–INM)/R14, and IR15 may be substantially given by (VREF–INP)/R15. Further, the collectors of transistor QN6 and QN12 are coupled together such that current $I_S$ is provided. Current $I_S$ is a full-wave rectified current. Additionally, transistors QP13–QP15 are arranged as current mirror such that current $I_S$ is mirrored to the collector of transistor QP15. QP17–QP19 is arranged as another current mirror that is arranged to mirror the collector current of transistor QP17 to provide currents Thresh1 and Thresh2. According to Kirchhoff's Current Law, the collector current of transistor QP17 is substantially given by Ibrec–$I_S$. The current mirror formed by transistors QP17–Q19 is arranged to provide currents Thresh1 and Thresh2 such that currents Thresh1 and Thresh2 are substantially given by Ibrec–$I_S$.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for pulse width modulation, comprising:
a first impedance circuit that is arranged to provide a first current from an input voltage;
a second impedance circuit that is arranged to provide a feedback current from a feedback voltage that is based, in part, on a pulse width modulation output signal, wherein the first and second impedance circuits are coupled together at a first node such that an amplifier input current is provided at the first node;
an amplifier circuit that is arranged receive the amplifier input current and a reference voltage, to provide a comparator input voltage such that a rate of change of the comparator input voltage is based on the amplifier input current, and to adjust a voltage at the first node such that the voltage at the first node is substantially equal to the reference voltage; and
a comparator circuit that is arranged to provide the pulse modulation output signal in response to a comparison of a threshold signal and the comparator input voltage.

2. The circuit of claim 1, wherein the amplifier circuit includes an integrator circuit.

3. A circuit for pulse width modulation, comprising:
a first impedance circuit that is arranged to provide a first current from an input voltage;
a second impedance circuit that is arranged to provide a feedback current from a feedback voltage that is based, in part, on a pulse width modulation output signal, wherein the first and second impedance circuits are coupled together at a first node such that an amplifier input current is provided at the first node;
an amplifier circuit that is arranged receive the amplifier input current and a reference voltage, to provide a comparator input voltage such that a rate of change of the comparator input voltage is based on the amplifier input current, and to adjust a voltage at the first node such that the voltage at the first node is substantially equal to the reference voltage;
a comparator circuit that is arranged to provide the pulse modulation output signal in response to a comparison of a threshold signal and the comparator input voltage
a third impedance circuit that is configured to provide a second current from another input voltage; and
a fourth impedance circuit that is configured to provide another feedback current, wherein the pulse width modulation output signal is differential such that the pulse width modulation output signal includes a first half and a second half; the feedback current is based, in part, on the first half of the pulse width modulation signal; the other feedback current is based, in part, on the second half of the pulse width modulation signal; the third and fourth impedance circuit are coupled together at a second node such that another amplifier input current is provided at the second node; and wherein the amplifier circuit is further arranged to receive the other amplifier current, and to adjust a voltage at the second node such that the voltage at the second node is substantially equal to the reference voltage.

4. The circuit of claim 3, wherein the first impedance circuit includes a first resistor, the second impedance circuit includes a second resistor, the third impedance circuit includes a third resistor, and wherein the fourth impedance circuit includes a fourth resistor.

5. The circuit of claim 3, wherein the amplifier circuit is a transimpedance amplifier circuit.

6. The circuit of claim 5, wherein the transimpedance amplifier circuit includes:
a first follower circuit including an output and an input that is coupled to the first node;
a first current mirror circuit including an output and an input that is coupled to the output of the first follower circuit;
a second follower circuit including an output and an input that is coupled to the second node;

a second current mirror circuit including an output and an input that is coupled to the output of the second follower circuit;

a capacitor circuit that is coupled between the output of the first current mirror circuit and the output of the second current mirror circuit;

a first buffer circuit that is coupled to the output of the first current mirror circuit, wherein the comparator input voltage is differential such that the comparator input signal includes a first half and a second half, and wherein the first buffer circuit is arranged to provide the first half of the comparator input voltage; and a second buffer circuit that is coupled to the output of the second current mirror circuit, wherein the second buffer circuit is arranged to provide the second half of the comparator input voltage.

7. The circuit of claim 5, further comprising:

an adjustable current source circuit that is arranged to provide a transimpedance amplifier bias current such that the transimpedance amplifier bias current is proportional to a power supply voltage, wherein the first follower circuit is arranged to provide a follower output current to the first current mirror circuit based, in part, on the amplifier input current; and wherein the first follower circuit includes another current mirror circuit that is arranged to adjust the follower output current based on the transimpedance amplifier bias current such that the follower output current is substantially independent of the power supply voltage.

8. The circuit of claim 3, further comprising:

a full-wave rectifier circuit that is arranged to provide the threshold signal by rectifying the input signal such that the threshold signal includes a full-wave rectified current.

9. The circuit of claim 8, wherein the comparator circuit includes:

a first comparator including first and second inputs;

a second comparator including first and second inputs;

a resistor that is coupled between the first input of the first comparator circuit and the second input of the second comparator circuit;

another resistor that is coupled between the second input of the first comparator circuit and the first input of the second comparator circuit; and a comparator logic circuit that is coupled to the first and second comparators.

10. The circuit of claim 8, further comprising:

an adjustable current source circuit that is arranged to provide a rectifier bias current such that the rectifier bias current is proportional to a power supply voltage, wherein the full-wave rectifier circuit is arranged to provide the full-wave rectified current such that the full-wave rectified current is based, in part, on the input voltage, the other input voltage, and the power supply voltage.

11. The circuit of claim 10, wherein the rectifier circuit includes:

a first differential amplifier circuit including a first input that is coupled to a third node, a second input, and an output that is coupled to another node, wherein the first differential amplifier circuit is arranged to operate such that a voltage at the third node substantially corresponds to the reference voltage;

a second differential amplifier circuit including a first input that is coupled to a fourth node, a second input, and an output that is coupled to the other node, wherein the second differential amplifier circuit is arranged to operate such that a voltage at the fourth node substantially corresponds to the reference voltage;

a fifth impedance circuit that is arranged to provide, at the third node, a first rectifier input current from the input voltage;

a sixth impedance circuit that is arranged to provide, at the fourth node, a second rectifier input current from the other input voltage; and a current mirror circuit that is arranged to receive a current mirror input current at the other node, and further arranged to provide the full-wave rectified current from the current mirror input current.

12. A circuit for class D amplification, comprising:

a first impedance circuit that is coupled to a first input node;

a second impedance circuit that is coupled between a first output node and the first input node;

a third impedance circuit that is coupled to a second input node;

a fourth impedance circuit that is coupled between a second output node and the second input node;

a first transimpedance amplifier circuit that is arranged to receive a reference voltage, to receive an amplifier input current at the first node, to provide a comparator input voltage such that a rate of change of the comparator input voltage is based, in part, on the amplifier input current, and to adjust a voltage at the first node such that the voltage at the first node is substantially equal to the reference voltage;

a threshold circuit that is arranged to provide a threshold signal;

a comparator circuit that is arranged to provide the pulse modulation output signal in response to a comparison of the threshold signal and the comparator input voltage; and a power stage that is arranged to provide an output signal at the output node in response to the pulse modulation output signal.

13. The circuit of claim 12, wherein the first impedance circuit includes a first resistor, the second impedance circuit includes a second resistor, the third impedance circuit includes a third resistor, and wherein the fourth impedance circuit includes a fourth resistor.

14. The circuit of claim 12, wherein the transimpedance amplifier circuit includes:

a first follower circuit including an output and an input that is coupled to the first node;

a first current mirror circuit including an output and an input that is coupled to the output of the first follower circuit;

a second follower circuit including an output and an input that is coupled to the second node;

a second current mirror circuit including an output and an input that is coupled to the output of the second follower circuit;

a capacitor circuit that is coupled between the output of the first current mirror circuit and the output of the second current mirror circuit;

a first buffer circuit that is coupled to the output of the first current mirror circuit, wherein the comparator input voltage is differential such that the comparator input signal includes a first half and a second half, the first buffer circuit is arranged to provide the first half of the comparator input voltage; and a second buffer circuit that is coupled to the output of the second current mirror circuit, wherein the second buffer circuit is arranged to provide the second half of the comparator input voltage.

15. The circuit of claim 12, further comprising:

an adjustable current source circuit that is arranged to provide a transimpedance amplifier bias current such that the transimpedance amplifier bias current is proportional to a power supply voltage, wherein the first follower circuit is arranged to provide a follower output current to the first current mirror circuit based, in part, on the amplifier input current; and wherein the first follower circuit includes a current mirror circuit that is arranged to adjust the follower output current based on the transimpedance amplifier bias current such that the follower output current is substantially independent of the power supply voltage.

16. The circuit of claim 12, wherein the threshold circuit is arranged to provide the threshold signal such that the threshold signal is proportional to a power supply voltage.

17. The circuit of claim 12, wherein the threshold circuit includes a full-wave rectifier circuit that is arranged to provide the threshold signal by rectifying the input signal such that the threshold signal includes a full-wave rectified current.

18. The circuit of claim 17, wherein the comparator circuit includes:

a first comparator including first and second inputs;

a second comparator including first and second inputs;

a resistor that is coupled between the first input of the first comparator circuit and the second input of the second comparator circuit;

another resistor that is coupled between the second input of the first comparator circuit and the first input of the second comparator circuit; and a comparator logic circuit that is coupled to the first and second comparators.

19. The circuit of claim 17, further comprising:

an adjustable current source circuit that is arranged to provide a rectifier bias current such that the rectifier bias current is proportional to a power supply voltage, wherein the first impedance circuit is arranged to receive a first half of a differential input signal, the second impedance circuit is arranged to received a second half of the differential input signal, the full-wave rectifier circuit is arranged to provide the full-wave rectified current such that the full-wave rectified current is based, in part, on the differential input signal and the rectifier bias current.

20. A circuit for pulse width modulation, comprising:

means for providing a first current to a first node from an input voltage;

means for providing a feedback current to the first node from a feedback voltage that is based, in part, on a pulse width modulation output signal;

means for adjusting a voltage at the first node such that the voltage at the first node is substantially equal to a reference voltage;

means for providing a comparator input voltage such that a rate of change of the comparator input voltage is based on an amplifier input current that is received from the first node; and means for providing the pulse modulation output signal in response to a comparison of a threshold signal and the comparator input voltage.

* * * * *